Figure 1:
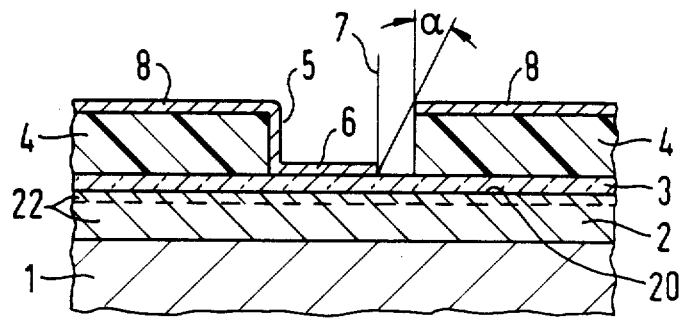

United States Patent [19]

Kraus

[11] Patent Number: 4,529,686
[45] Date of Patent: Jul. 16, 1985

[54] METHOD FOR THE MANUFACTURE OF EXTREMELY FINE STRUCTURES

[75] Inventor: Friedrich Kraus, Riemerling, Fed. Rep. of Germany

[73] Assignee: Siemens Aktiengesellschaft, Berlin and Munich, Fed. Rep. of Germany

[21] Appl. No.: 514,857

[22] Filed: Jul. 18, 1983

Related U.S. Application Data

[63] Continuation of Ser. No. 343,955, Jan. 29, 1982, abandoned.

[30] Foreign Application Priority Data

Feb. 3, 1981 [DE] Fed. Rep. of Germany ....... 3103615

[51] Int. Cl.³ .............................................. G03C 5/00
[52] U.S. Cl. .................................... 430/314; 430/315; 430/317; 430/316; 430/318; 430/324; 427/63; 427/99; 156/659.1
[58] Field of Search ................... 430/5, 314, 315, 324, 430/316, 317, 318; 427/63, 191, 282, 272, 250, 99; 204/192 S; 156/659.1

[56] References Cited

U.S. PATENT DOCUMENTS 3,387,360 6/1968 Nakamura et al. ................... 29/579
3,567,508 3/1971 Cox et al. ......................... 430/315 X
4,218,532 8/1980 Dunkleberger ....................... 430/314

OTHER PUBLICATIONS

Jelks et al., Appl. Phys. Lett., 34 (1), Jan. 1, 1979, pp. 28–30.
Jelks et al., Appl. Phys. Lett., 38 (11), Jun. 1, 1981, pp. 933–935.

Primary Examiner—John E. Kittle
Assistant Examiner—José G. Dees
Attorney, Agent, or Firm—Herbert L. Lerner; Laurence A. Greenberg

[57] ABSTRACT

Method for the manufacture of extremely fine structures and masks with extremely fine structures on substrates, which includes depositing at least one structured mask and at least one material deposit on a substrate, while depositing the material deposit on the structured mask at a given angle.

8 Claims, 8 Drawing Figures

METHOD FOR THE MANUFACTURE OF EXTREMELY FINE STRUCTURES

This application is a continuation of application Ser. No. 343,955, filed Jan. 29, 1982, now abandoned.

The invention relates to a method for the manufacture of extremely fine structures on substrates and masks with extremely fine structures.

The fabrication of fine structures disposed on semiconductor disks is frequently accomplished by means of photolithographic removal or drawing, since other conventional etching processes cannot be used in most cases because of the etching undercuts to be made for fabricating fine structures. When fabricating fine structures having dimensions of less than 1 μm, however, the diffraction of the ultraviolet light interferes with the lithographic process. This engineering limitation can be overcome by switching to shorter-wave light such as X-rays or electronbeams. However, this technology is extremely expensive and requires a matchingly high engineering input, so that generally it is not used for the mass production of semiconductor components.

It is accordingly an object of the invention to provide a method for the manufacture of extremely fine structures, which overcomes the hereinafore-mentioned disadvantages of the heretofore-known methods of this general type, and to provide a method through which contact structures or masks having minimal dimensions ranging from 0.1 μm to 1 μm can be deposited on substrates by means of simple and inexpensive engineering, where simultaneously the possible electrical resistance of the manufactured contact structures is kept to a minimum, i.e., the metallic cross-section is kept as large as possible.

With the foregoing and other objects in view there is provided, in accordance with the invention, a method for the manufacture of extremly fine structures and masks with extremely fine structures on substrates, which comprises depositing at least one structural mask and at least one material deposit on a substrate, while depositing the material deposit on the structural mask at a given angle.

In accordance with another mode of the invention, there is provided a method which comprises depositing part of the material deposit between portions of the structural mask.

When depositing a relatively thick, structured mask, e.g. as is the case with a photosensitive resist, at such a degree of fineness, that the interspaces or gaps formed by the mask assume dimensional orders of magnitude of 1 μm, and upon subsequently making deposits of material on this mask at a specified angle, then within the mask recesses material is deposited to cover only part of these recesses by starting from one photosensitive resist edge, while because of the shadow masking effect part of the recesses remains free of material up to the other respective photosensitive resist edge. Subsequently, this second mask formed in the photosensitive resist gaps can serve either as a mask for the manufacture of contacts or as a base for depositing a third mask in a manner similar to the second mask. This method can be repeatedly applied. Thus the mask deposited in the gap of the photosensitive resist mask can be used for generating masking gaps, which definitely are smaller than 1 μm. Specifically, in this way both masking gaps and contact structures having a width of 0.1 μm to 1 μm can be fabricated. A subsequent evaporating with contact material forms sufficiently elevated structures, so that the resultant transit path resistance is as low as possible.

Compared with the engineering input which X-ray and electronbeam techniques respectively require for generating structures such as these, the technical input for the method according to the invention is negligibly low.

In accordance with a further mode of the invention, there is provided a method which comprises providing the substrate in the form of a semiconductor substrate having at least one layer.

In accordance with an added mode of the invention, there is provided a method which comprises providing the material deposit in the form of at least one material from the group consisting of a material suitable for mask fabrication and a contact material.

In most cases of semiconductor engineering contact layers are provided for semiconductor substrates. Frequently the fabrication process is improved by coating a semiconductor substrate with one or more layers ahead of the application of contact structures. The method according to the invention, however, is not limited to the use of semiconductor substrates.

In accordance with an additional mode of the invention, there is provided a method which comprises depositing an insulator layer on a surface of the semiconductor substrate, forming the structured mask be depositing and photo-technically structuring a photoresist layer on the insulator layer in a known manner, forming the material deposit by directionally depositing an etch-resistant material on the photoresist layer at a given angle producing a shadow region of the insulator layer free of the etch-resistant material, subsequently etching the shadow region of the insulator layer free of etch-resistant material, subsequently depositing contact material on the surface of the semiconductor substrate at the etched region, and removing at least part of the photoresist layer and the contact layer.

In accordance with again another mode of the invention, there is provided a method which comprises depositing the contact material on at least part of the photoresist layer during the step of depositing the contact material on the surface of the semiconductor substrate, and removing the part of the contact material on the photoresist layer and the part of the photoresist layer therebelow during the step of removing at least part of the photoresist layer and contact layer.

In accordance with again a further mode of the invention, there is provided a method which comprises dividing the photoresist layer into parts, and depositing the material deposit between the parts of the photoresist layer during the directionally depositing step.

In accordance with again an added mode of the invention, there is provided a method which comprises forming the insulator layer of at least one material from the group consisting of $Si_3N_4$, $SiO_2$, $SiO$, and $Al_2O_3$, forming the etch-resistant material of titanium, performing the etching of the insulator layer by means of plasma etching, depositing the contact material by evaporating, and removing the photoresist layer and contact material by stripping.

This method according to the invention can be used for providing semiconductor disks, specifically comprising gallium arsenide (GaAS), e.g., with 0.1 μm to 1 μm wide linear metal contacts, which can be used, e.g., as gates for field-effect transistors. The electrical resistance of these metal contacts is advantageously low because of the large cross-sectional area thereof.

In accordance with again an additional mode of the invention, there is provided a method which comprises applying a first titanium layer and then a layer of etchable material on a surface of the semiconductor substrate, depositing a second titanium layer on the layer of etchable material, forming the structured mask by depositing a photoresist mask in a known manner on parts of the second titanium layer leaving other parts of the second titanium layer free of masking, subsequently removing the second titanium layer at the other parts thereof being free of masking to expose parts of the etchable layers, forming the material deposit by subsequently depositing a third titanium layer at least on the photoresist mask at a given angle, subsequently removing the exposed parts of the etchable material layer beneath the third titanium layer exposing parts of the first titanium layer, subsequently depositing contact material on the exposed parts of the first titanium layer, subsequently removing at least part of the photoresist layer and the contact layer on it, subsequently etching off the second titanium layer by means of a titanium etchant, and subsequently removing the etchable layer and etching-off the first titanium layer.

In accordance with yet another mode of the invention, there is provided a method which comprises forming the etchable layer of copper, removing the parts of the second titanium layer by etching, removing the parts of the copper etchable layer in the shadow region beneath the third titanium layer by sputter etching, depositing the contact material on the exposed parts of the first titanium layer by evaporation, removing the at least part of the photoresist layer and the contact material on it by stripping, removing the copper layer by sputtering, and etching-off the first titanium layer with a titanium etchant.

In accordance with yet a further mode of the invention, there is provided a method which comprises applying a first incineratable material layer on a surface of the semiconductor substrate, depositing a second titanium layer on the first incineratable layer, forming the structured mask by depositing a photoresist mask in a known manner on parts of the second titanium layer leaving other parts of the second titanium layer free of masking, subsequently removing the second titanium layer at the other parts thereof being free of masking to expose parts of the first incineratable layer, forming the material deposit by subsequently depositing a third titanium layer at least on the photoresist mask at a given angle, subsequently removing the exposed parts of the incineratable material layer in the shadow region beneath the third titanium layer exposing parts of the substrate surface, subsequently depositing contact material on the exposed parts of the substrate surface, subsequently removing at least part of the photoresist layer and the contact layer on it, subsequently etching-off the second titanium layer by means of a titanium etchant, and subsequently removing the incineratable layer.

In accordance with yet an added mode of the invention, there is provided a method which comprises forming the incineratable layer of lacquer, removing the parts of the second titanium layer by etching, removing the parts of the lacquer layer beneath the third titanium layer by incineration, depositing the contact material on the exposed parts of the substrate surface by evaporation, and removing the at least part of the photoresist layer and the contact material by stripping.

In accordance with yet an additional mode of the invention, there is provided a method which comprises removing the lacquer layer by detaching.

In accordance with still a further mode of the invention, there is provided a method which comprises removing the lacquer layer by incinerating.

In accordance with a concomitant mode of the invention, there is provided a method which comprises dividing the photoresist layer into parts and depositing the material deposit between the parts of the photoresist layer during the step of depositing the third titanium layer at the given angle.

With this embodiment of the method according to the invention as well, extremely fine linear metal contacts ranging in width from 0.1 $\mu$m to 1 $\mu$m can be manufactured, and specifically on gallium arsenide (GaAs) semiconductor substrates.

These methods according to the invention are also usable for other semiconductor substrates.

Based on the method according to the invention, linear contacts ranging in width from 0.1 $\mu$m to 1 $\mu$m which are well produced can be fabricated. These are specifically, low-noise gallium arsenide (GaAs) field-effect transistors having short gate-field lengths.

Other features which are considered as characteristic for the invention are set forth in the appended claims.

Although the invention is illustrated and described herein as embodied in a method for the manufacture of extremely fine structures, it is nevertheless not intended to be limited to the details shown, since various modifications may be made therein without departing from the spirit of the invention and within the scope and range of equivalents of the claims.

Figure 2:
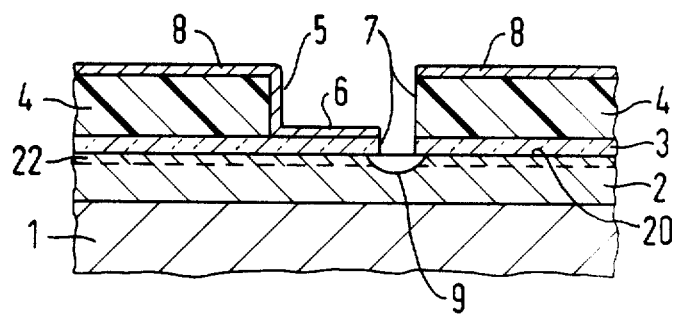
Figure 3:
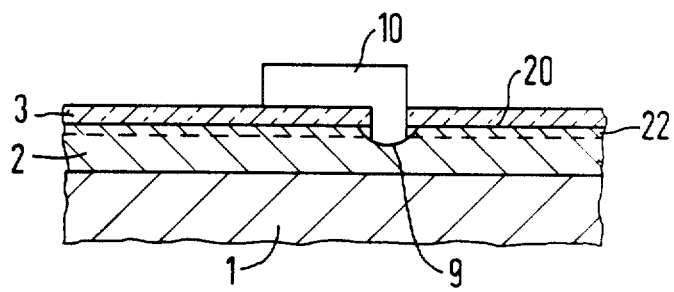

The invention, however, together with additional objects and advantages thereof will be best understood from the following description when read in connection with the accompanying drawings, in which:

FIGS. 1–3 are fragmentary, diagrammatic, cross-sectional views of a device constructed according to a first embodiment of the method of the invention; and FIGS. 4–8 are views similar to FIGS. 1–3 illustrating a second embodiment of the method according to the invention.

Referring now to the figures of the drawing and first particularly to FIG. 1 thereof, there is seen a substrate 1, which on one side thereof is provided with a semiconductor layer 2. The surface 20 of the layer 2 has a highly doped layer 22, which assures a good contact with contacts provided thereon. An insulator layer 3, which is formed, for example, of $Si_3N_4$ and/or SiO and/or $Al_2O_3$, is deposited on the semiconductor layer 2. A photoresist mask 4 is deposited on the insulator layer 3. Into gaps 5 in the photoresist mask 4, an etch-resistant material such as titanium (Ti), is deposited at an angle $\alpha$, so that within these gaps 5 layers 6 are formed. Because of the application of a directional evaporation, the layer 6 does not cover the entire insulator layer 3 in the gap 5 but generates a gap 7 in a shadow region between the photoresist mask 4 and the layer 6. Upon the etch-resistant material, aside from the layer 6, there are layers 8 formed on the photoresist mask 4.

In the following description of FIGS. 2 through 8, elements which are identical with those in FIG. 1 are provided with the same reference symbols, and will therefore not be described again.

FIG. 2 shows a construction similar to FIG. 1, in which the insulator layer 3 within the gap 7 is etched off therebelow. During this etching parts of the semiconductor layer 2 are also removed, so that a recess 9 is developed in this layer 2 within the gap 7.

FIG. 3 represents a construction according to FIG. 2, in which contacts 10 are generated in the recesses 9, and in any given case also on the layers 6, by an evaporation over the entire surface of the device according to FIG. 2. The photoresist mask 4 according to FIG. 2 together with the layers 8 disposed thereon was removed, which can be done, for example, by means of a delamination or removal technique after the contacts 10 have been deposited.

Figure 4:
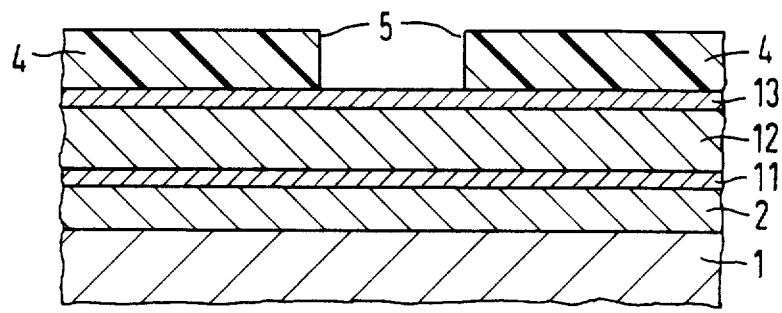
Figure 5:
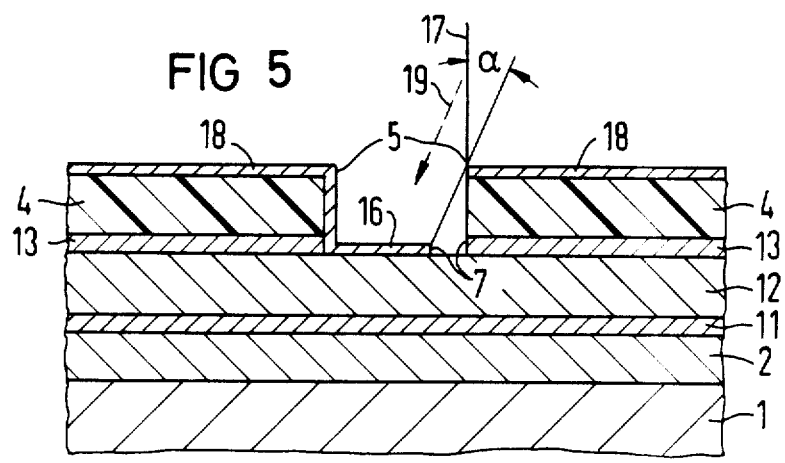

In FIG. 4, by contrast with FIG. 1, applied to the semiconductor layer 2 is a first titanium layer 11, a copper layer 12 disposed thereon, and a second titanium layer 13 on the layer 12. On this layer 13, there is positioned a photoresist mask 4 having gaps 5 formed therein. FIG. 5 differs from FIG. 4 in that parts of the second titanium layer 13 in the gaps 5 of photoresist mask 4 have been removed, such as by means of etching, and that a directional titanium deposit has been made at an angle α relative to the normal 17 to the disk, so that within the gaps 5 of photoresist mask 4 a third titanium layer 16 is formed, and/or on the photoresist mask 4 another third titanium layer 18 is formed. The direction of the third titanium deposit is indicated by the arrow 19. In the shadow region of the directional deposit, gaps 7 are generated.

Figure 6:
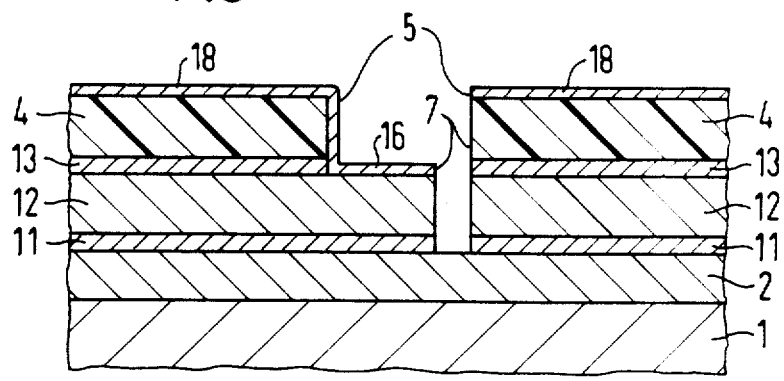

In FIG. 6, as compared to FIG. 5, the parts of the copper layer 12 and the first titanium layer 11 disposed beneath the gap 7 are removed, such as by means of etching, so that the gap 7 extends all the way down to the semiconductor layer 2. If so desired, the etching can be so carried out in such a way that even parts of the semiconductor layer 2 can be removed along with this operation as described in FIG. 2, by means of which embedded or sunken contacts can be fabricated.

Figure 7:
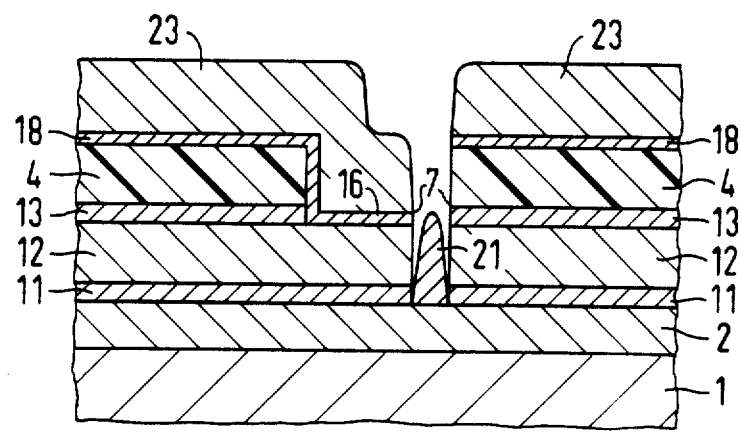

In FIG. 7 on contacts 21 are deposited the semiconductor layer 2 within the gap 7, such as by means of evaporating. Simultaneously with this deposit, a contact layer 23 is formed on top of the photoresist mask 4 and/or on the third titanium layers 16, 18, respectively.

Figure 8:
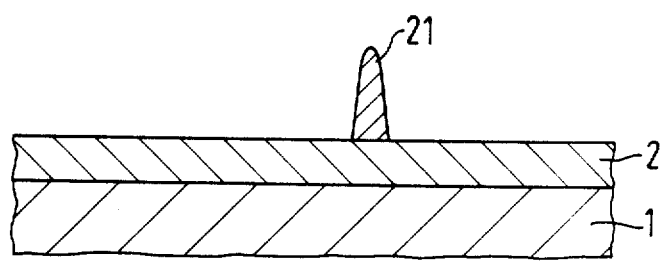

In FIG. 8 all layers on top of the semiconductor layer 2 have been removed except for the contacts 21. In this case the third titanium layers 18 and contact layers 23 on the photoresist mask 4 are removed, such as by swelling and detaching (lift off technique) of the photoresist mask 4. Subsequently the second titanium layer 13 plus the third titanium layer 16 can be removed from the gaps of the photoresist mask 4 by means of etching. In the same way, the copper layer 12 and the first titanium layer 11, respectively, can be stripped or removed, such as by means of various etching methods.

In case a titanium layer is desired or at least has not disturbing effect on the contacts 2, the first titanium layer 11 within the gap 7 in FIG. 6 can be retained, and a direct deposit of the contacts 21 thereon can be made.

The embodiment of the method according to the invention as described in FIGS. 4 through 8 can also be varied in such a way that instead of the first titanium layer 11 and the copper layer 12, a lacquer layer is deposited. By using lacquer layers instead of etchings, incineration can also be carried out.

The contacts 10 and 21, can be provided, for example, as titanium-platinum-gold contacts or as molybdenum-gold contacts or as tungsten-gold contacts or as titanium-tungsten-molybdenum-gold contacts.

To fabricate gallium arsenide field-effect transistors according to the method shown in FIGS. 1 through 3, a semi-insulating gallium arsenide substrate is provided with a highly doped contact layer, and is provided with a lower-doped active layer therebelow being generated by epitaxial or ion implantation. The limitation of the conductive layers can be effected by means of photoresist masking and mesa etching. In implantation cases those parts of the semi-insulating substrate surface which are supposed to remain insulated, can also be covered first by photoresist lacquer. To cure the implanted layer, a layer of, for example, 200 nm $Si_3N_4$, can be sputtered on. In epitaxial cases, too, a similar insulating layer is applied. At those points where the source and drain are to be applied, photo-technical means are used at first for removing the $Si_3N_4$-layer, e.g. through $CF_4$-plasma etching, and then for the applying and alloying of ohmic contacts. A subsequent phototechnique which, as is shown in FIG. 1, exposes gaps 5 about 1 μm in width as gate strips and associated conduction paths, is subjected to a directional titanium evaporation. Preferably the incident angle α of the directional titanium evaporation relative to the normal to the disk amounts to 10° to 20°; the evaporation results at a layer thickness of about 10 nm. Because of this directional evaporation in the shadow region of photoresist edges between certain photoresist edges and the evaporated-on titanium layer, gaps 7 of about 0.3 μm in width are formed as shown in FIG. 7. In these gaps 7 the $Si_3N_4$ layer is not covered by the evaporated titanium layer and therefore can be etched off, such as by means of $CF_4$-plasma. Subsequently in the gap 7 the highly doped contact layer 22 can become etched off, so that the recesses 9 are produced as shown in FIGS. 2 and 3. Upon a subsequent deposit of contacts, the contacts 10 as shown in FIG. 3 are formed provided that following the contact deposit the photoresist layer and adjacent contact layers are removed by means of delamination. The contacts 10 generated in this way form gates for subsequently generated field-effect transistors having a gate length of 0.1 μm to 1 μm.

Accordingly, the completed field-effect transistors have the advantage of having extremely narrow gate strips, namely 0.1 to 1 μm wide, and simultaneously have the advantage of having embedded gates.

The etching away of the highly doped layer 22 beneath the gate has the advantageous effect of producing sufficiently deep penetrations for gate applied electrical fields while maintaining the good contact beneath the source and drain contacts, and the low layer resistance between the source, gate, and drain.

If no titanium layers 6 from FIG. 2 are desired for the fabrication of contacts 10, then these layers can also be removed ahead of the deposit of the contacts.

The above-mentioned materials used for the insulator layer 3 can also include SiO, $SiO_2$ or $Al_2O_3$.

The use of titanium for directional evaporations is not binding, but rather other etch-resistant materials can be used equally well.

For fabricating the gate contact 10, aluminum and/or titanium and/or platinum and/or gold and/or tungsten and/or gold can be considered, for example.

The described method can be advantageously applied to generating low-noise gallium arsenide field-effect transistors.

The described method is not at all limited to the fabrication of gallium arsenide field-effect transistors. In a like manner it can be applied to generating narrow slots in the layers serving as evaporator masks for fabricating any given structures of 0.1 μm to 1 μm in width and several μms in height.

In FIGS. 4 through 8 a further embodiment is shown for fabricating extremely fine, but on the other hand, elevated contacts on a semiconductor substrate. For this purpose, a device according to FIG. 4 is directionally evaporated-on, for example by means of an etch-resistant material such as titanium, the evaporating direction being preferably set at an angle α=10° to 20° being formed with the normal to the disk. In this way, as shown in FIG. 5, in the gaps 5 of the photoresist mask the third titanium layers 16 are again generated due to the gap 7 produced by the directional evaporation. The part of the copper layer 12 beneath the gap 7 is removed, such as by means of sputter etching, so that a device as shown in FIG. 6 results. If a lacquer layer is used instead of the first titanium layer 11 and the copper layer 12, then the part of the lacquer layer beneath the gap 7 can be removed by reduction to ashes or incineration.

On the surface of the semiconductor layer 2 thus exposed, contacts can be applied in a known manner, the contacts having widths ranging from 0.1 μm to 1 μm (as seen in FIG. 7) because of the fineness of the gap 7. After removing the rest of the layers applied to the semiconductor surface, such as by removing the photoresist mask 4 and the metal layers applied thereon by means of a stripping technique, the removal of the second titanium layer 13 and the third titanium layer 16, such as by means of a highly diluted mixture of hydrofluoric acid and nitric acid, and the removal of the copper layer 12 by means of sputter etching, and the removal of the remaining titanium layer 11 by the mentioned Ti-etching and the removal if the lacquer layer, respectively, which can be applied instead of the copper and first titanium layers, by reduction to ashes or incineration, what is finally left is the fineness of contacts 21 applied in their desired manner to the semiconductor layer 2, while all other layers are removed. This is similar to the embodiment according to FIGS. 1–3, and also the embodiment according to FIGS. 4–8, wherein the contacts 21 can be applied as embedded contacts to the semiconductor layer 2, if recesses are etched into this layer ahead of the contact desposition.

The method according to the invention is not limited to the fabrication of field-effect transistors. Rather, it can be applied to the fabrication of a Gunn-logic or generally to wiring with extremely fine structures ranging between 0.1 μm and 1 μm.

I claim:

1. Method for the manufacture of extremely fine structures on substrates, which comprises:
   (a) depositing an insulating layer on a semiconductor substrate;
   (b) depositing a photoresist layer over the entire surface of the insulating layer and subsequently structuring the photoresist layer forming a photoresist mask with first gaps formed therein in which the insulating layer is exposed;
   (c) subsequently directionally depositing etch-resistant material forming an etch-resistant material layer on the photoresist mask and forming another etch-resistant material layer on the insulating layer in a portion of the first gaps simultaneously leaving second smaller gaps free of etch-resistant material in which the insulating layer is exposed in shadow regions of the photoresistant mask;
   (d) etching away the insulating layer in the second gaps which are free of etch-resistant material;
   (e) subsequently nondirectionally depositing contact material over the entire surface of the etch-resistant material layers and on the semiconductor substrate in the second gaps to at least 1.0 μm thickness forming contacts above the photoresist mask and in the first and second gaps; and
   (f) subsequently removing the photoresist mask and the contacts disposed thereon with a lifting technique.

2. Method according to claim 1, which comprises selecting titanium as the etch-resistant material.

3. Method according to claim 1, which comprises etching away parts of the semiconductor substrate when etching away the insulating layer.

4. Method according to claim 1, which comprises forming the contacts in the second gaps between 0.1 μm and 1 μm wide.

5. Method for the manufacture of extremely fine structures on substrates, which comprises:
   (a) depositing a first titanium layer over the entire surface of a semiconductor substrate;
   (b) depositing a copper layer over the entire surface of the first titanium layer;
   (c) depositing a second titanium layer over the entire surface of the copper layer;
   (d) depositing a photoresist layer over the entire surface of the second titanium layer and subsequently structuring the photoresist layer forming a photoresist mask with first gaps formed therein in which parts of the second titanium layer are exposed;
   (e) removing the exposed parts of the second titanium layer in the first gaps;
   (f) subsequently directionally depositing titanium forming a third titanium layer on the photoresist mask and on the copper layer in a portion of the first gaps simultaneously leaving second smaller gaps in which parts of the copper layer are exposed in shadow regions of the photoresist mask;
   (g) removing the exposed parts of the copper layer and parts of the first titanium layer below in the second gaps extending the second gaps to the semiconductor substrate and leaving parts of the semiconductor substrate exposed;
   (h) subsequently nondirectionally depositing contact material over the entire surface of the exposed parts of the semiconductor substrate and over the entire surface of the third titanium layer forming contacts in the second gaps and on the third titanium layer to at least 1.0 μm thickness, and
   (i) subsequently removing the contacts disposed on the third titanium layer, the third titanium layer, the photoreist mask, the second titanium layer and the copper layer.

6. Method according to claim 5, which comprises simultaneously removing parts of the semiconductor substrate when removing the exposed parts of the copper layer and the first titanium layer below.

7. Method according to claim 5, which comprises removing the first titanium layer when removing the contacts disposed on the third titanium layer, when removing the third titanium layer, when removing the photo-resist mask, when removing the second titanium layer and when removing the copper layer.

8. Method according to claim 5, which comprises forming the contacts in the second gaps between 0.1 μm and 1 μm wide.

* * * * *